United States Patent [19]

McCulloch et al.

[11] Patent Number: 6,060,212
[45] Date of Patent: May 9, 2000

[54] 193 NM POSITIVE-WORKING PHOTORESIST COMPOSITION

[75] Inventors: Iain McCulloch, Basking Ridge; Anthony J. East, Madison; Ming Kang, Colonia, all of N.J.; Richard Keosian, Nazareth, Pa.; Hyun-Nam Yoon, New Providence, N.J.

[73] Assignee: Clariant Finance (BVI) Limited, Virgin Islands (Br.)

[21] Appl. No.: 09/096,036

[22] Filed: Jun. 11, 1998

[51] Int. Cl.⁷ ............................. G03C 1/492; C08F 20/00
[52] U.S. Cl. ...................... 430/270.1; 430/326; 525/450
[58] Field of Search .......................... 430/270.1, 326; 525/450

[56] References Cited

U.S. PATENT DOCUMENTS 5,474,872  12/1995  Torno et al. ............................ 430/270
5,585,223  12/1996  Fréchet et al. ......................... 430/296

OTHER PUBLICATIONS

R.P. Meagly et al, "A New Approach to 193 nm Photoresists: Polyspironorbornane Polymers", Proceedings Of SPIE, Advances In Resist Technology and Processing XV, vol. 3333, No. 1, Feb. 19989 (1998–02), pp. 83–90.

Chemical Amplification in the Design of Dry Developing Resist Materials, I. Hiroshi et al, vol. 23, No. 18 (Dec., 1983) 1012–1018.

Impact of 2–Methyl–2–Adamantyl Group Used for 193–nm Single–Layer Resist, S. Takechi et al, vol. 9, No. 3 (1996) 475–488.

*Primary Examiner*—Janet Baxter
*Assistant Examiner*—Rosemary Ashton
*Attorney, Agent, or Firm*—Sangya Jain

[57] ABSTRACT

A polymer that when used with a suitable photoacid generator (PAG) forms a positive working photoresist. The polymer comprises of a tartaric polyanhydride backbone, an acetal protected 1,2 diol group; and a fused ring acetal group pendant to the backbone. The acetal protected α-hydroxy anhydride backbone structure, undergoes an efficient photoacid catalyzed cleavage, which gives rise to small molecular weight fragments which are readily dissolved in an aqueous base developer. This high contrast in solubility allows high resolution images to be produced. The fused rings offer etch resistance and can be comprised of either an adamantone or norcamphor ring structure. With the addition of a commercially available photo acid generator, the polymer formulation forms a positive working photoresist that offers high contrast and resolution.

7 Claims, No Drawings

193 NM POSITIVE-WORKING PHOTORESIST COMPOSITION

BACKGROUND OF THE INVENTION

The present invention is directed to polymers that when used with a suitable photoacid generator (PAG), form a positive working photoresist which is particularly suitable for use at extremely short wavelengths such as 193 nm.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then heated to evaporate any solvent in the photoresist composition and to fix the coating onto the substrate. The coated surface of the substrate is next masked and subjected to exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this masked exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed to radiation, the areas of the resist composition exposed to the radiation become less soluble to a developer solution while the unexposed areas of the photoresist coating remain soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed to radiation, those areas of the photoresist composition exposed to the radiation become more soluble to the developer solution while those areas not exposed remain insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After development, the now partially unprotected substrate may be treated with a substrate-etchant solution or plasma gas and the like. The etchant solution or plasma gases etch that portion of the substrate where the photoresist coating was removed during development. The areas of the substrate where the photoresist coating still remains are protected and, thus, an etched pattern is created in the substrate material, which corresponds to the photomask used for the exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Photoresist resolution is defined as the smallest feature which the resist composition can transfer from the photomask to the substrate with a high degree of image edge acuity after exposure and development. In most manufacturing applications today, resist resolution on the order of less than one micron is necessary. In order to provide such so called sub-micron resolution photolithography processes have used increasingly shorter wavelengths of light. Photolithography processes have progressed from visible light, to ultraviolet (I-line) to deep ultraviolet (248 nm) to the wavelength of 193 nm, which can be generated by argon/fluoride lasers. In addition, it is almost always desirable that the developed photoresist wall profiles be near vertical relative to the substrate. Such demarcations between developed and undeveloped areas of the resist coating translate into accurate pattern transfer of the mask image onto the substrate.

As semiconductor manufacturing processes seek higher and higher resolutions many previously useable photoresist compositions become unworkable. Many photoresist compositions, such as novolacs and alkoxy styrenes, which contain a phenyl group, are simply not transparent at wavelengths below 240 nm and others do not dissolve sufficiently cleanly to provide the requite resolution. The polymer formulation of the present invention is sufficiently transparent to wavelengths above 180 nm so as to be useable in photoresist compositions at these wavelengths. In addition, the mechanism for photoacid catalyzed cleavage results in the efficient formation of highly soluble, small molecule fragments which will give higher contrast images than the conventional resin approach which only gives rise to a solubility change in the polymer. The present polymer, which contains the active acetal protected α-hydroxy anhydride group, when used with a suitable photoacid generator, will decompose into a series of small molecular weight, water-soluble fragments, as cleavage of the polymer will occur at both the acetal and anhydride sites. The products from this photoacid cleavage are significantly more polar, which creates a large solubility difference between polymer and product, resulting in high contrast and high resolution.

SUMMARY OF THE INVENTION

The present invention is directed to polymers that when used with a suitable photoacid generator (PAG) form a positive working water-soluble photoresist. The polymer of the present invention is useable at wavelengths above 180 nm as it has a chemical structure which is transparent in this spectral region. The polymer is comprised of a polyanhydride backbone, with fused ring structures chemically attached throughout the length of the chain as illustrated in the diagrams to follow. With the addition of a photo acid generator, and dissolved in a spin casting solvent, the polymer formulation forms a positive working photoresist composition.

The unique feature of this resin is that the backbone structure contains an acetal protected α-hydroxy anhydride. On exposure to acid, this anhydride undergoes efficient cleavage, as the acetal side group cleaves, which gives rise to highly developer soluble small molecular weight fragments. This reaction occurs more readily than the ester cleavage reactions used in conventional resists. In addition, the rapid dissolution characteristics of the photoproducts and solubility contrast between resin and products both contribute to the formation of high contrast, high resolution images.

DESCRIPTION OF THE PREFERRED EMBODIMENTS

The present invention is directed to a polymer particularly suitable for use as a photoresist. The polymer is comprised of a polyanhydride backbone, with fused ring structures chemically attached throughout the length of the chain as set forth in the diagrams to follow. With the addition of a photo acid generator and dissolved in a spin casting solvent, the polymer formulation forms a positive working photoresist composition. Exposure to radiation will cause a photoacid catalyzed deprotection of the acetal group and cleavage of the anhydride linkage, yielding low molar mass material; soluble in an aqueous based developer. The polymers are transparent to wavelengths above 180 nm and will therefore be useful as resists operating at the ArF eximer laser wavelength of 193 nm and the KrF wavelength of 248 nm. In addition the fused ring structure offers enhanced etch resistance, while the decomposition product will provide a high solubility contrast between exposed and unexposed regions, leading to high resolution images.

Polymer structures are illustrated in the following FIGS. (1) and (2). The polymer comprises of a tartaric anhydride backbone with an acetal protected 1,2 diol group. The acetal pendant group is either an adamantone or norcamphor fused ring structure.

Adamantone Tartaric Polyanhydrides

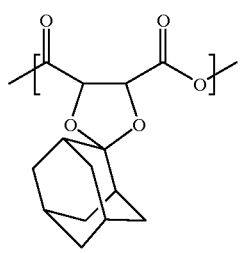

(1)

Norcamphor Tartaric Polyanhydrides

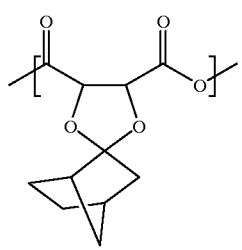

(2)

The polymers of the present invention are generally in the form of a solid powder. A photoresist formulation however, is a liquid solution of the polymer, a PAG and a solvent. Generally a solution useful as a photoresist will contain 1–30% by weight of polymer powder, a photoacid generator in an amount effective to cause cleavage of the active group of the polymer upon exposure to radiation, with the remainder being a suitable solvent. A suitable solvent for use with the polymers of this invention is PGMEA (propylene glycol monomethyl ether acetate). Other suitable solvents are also commercially available. Photoacid generators useable with the polymers of the present invention are commercially available. The requirement is that, upon exposure to radiation of the appropriate wavelength, the photoacid generator generates sufficient acid to cause cleavage of the acetal and anhydride moieties. Suitable photoacid generators include onium salts, hydroxymaleimide triflates and diazonium sulfonates. Different photoacid generators are activated by different wavelengths of light; thus the selection of a photoacid generator may be based on the resolution requirements of the microlithography. Various processes can alter the resolution and sensitivity of the photoacid generators. For example, onium salts can also be sensitized with anthracenes for use in i-line microlithography processes. A listing of other photoacid generators is found at column 3 of U.S. Pat. No. 5,585,223 (Frechet et al) issued Dec. 17$^{th}$ 1999, the disclosure of which is hereby incorporated by reference as if fully set forth herein.

The prepared photoresist composition solution can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group IIIN compounds.

The photoresist coatings of the present invention are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion-promoting layer of a suitable composition, such as one containing hexa-alkyl disilazane.

The photoresist composition solution is then coated onto the substrate, and the substrate is treated or "soft baked" at a temperature from about 70° C. to about 200° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of a micron in thickness, remains on the substrate. The treatment is conducted until the rate of change of solvent removal becomes relatively insignificant. The temperature and time selection of the soft bake depends on the photoresist properties desired by the user, as well as the equipment used and commercially desired coating times.

The coated substrate can then be exposed to actinic radiation, e.g., ultraviolet radiation, at a wavelength of from about 180 nm to about 500 nm, x-ray, electron beam, ion beam or laser radiation, in any desired pattern, produced by use of suitable masks, negatives, stencils, templates, etc. Exposure to radiation will activate the photoacid generator and cause a photoacid-catalyzed deprotection of the acetal group and anhydride cleavage. The photoresist may then be subjected to a post exposure second baking or heat treatment either before or after development.

The exposed photoresist-coated substrates are developed to remove the exposed areas by immersion in an aqueous alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances.

Photoresists of the present invention may also contain other optional ingredients such as colorants, dyes, anti-striation agents, sensitizers, leveling agents, plasticizers, adhesion promoters, speed enhancers, solvents and such surfactants as non-ionic surfactants may be added to the solution of the polymer resin, sensitizer and solvent before the photoresist composition is coated onto a substrate.

The solvents may be present in the overall composition in an amount of up to 95% by weight of the solids in the composition. Solvents of course are substantially removed after coating of the photoresist solution on a substrate and drying. Non-ionic surfactants that may be used include, for example, nonylphenoxy poly(ethyleneoxy) ethanol; octylphenoxy ethanol.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

In the examples to follow, examples 1 through 3 show the formation of a polymer containing an anhydride backbone, and an adamantone containing fused ring acetal pendant group. Examples 4 through 6 show the formation of a polymer containing an anhydride backbone, and a norcamphor containing fused ring acetal pendant group.

EXAMPLE 1

Preparation of dimethyl 2,3-adamantanone-L-tartrate

A mixture of dimethyl L-tartrate (9.18 g, 0.051 mol), 2-adamantanone (7.59 g, 0.05 mol), and p-toluenesulfonic acid (250 mg) in toluene (100 ml) was refluxed for 48 h (Dean-Stark water separator, 0.6 ml of water). The solution was cooled and washed with aqueous sodium bicarbonate (5%, 2×100 ml), water (100 ml) and brine (100 ml). The organic layer was dried ($MgSO_4$), filtered, and solvent removed under reduced pressure to give dimethyl 2,3-adamantanone-L-tartrate as a colorless liquid (15.9 g) in 94% yield. $^1$H NMR (200 MHz, $CDCl_3$, δ ppm): 4.75 [s, 2H, —COCH(O)CH(O)CO—], 1.6~2.1 (m, 14H, H-b~H-j, adamantanone), 1.25 (s, 6H, —$OCH_3$). $^{13}$C NMR (200 MHz, $CDCl_3$, δ ppm): 169 (—$CO_2$—), 117 [—O(R)C(R)O—], 77 [—CHCH(O)$CO_2$—], 37-j, 36-b, f, 34-c, e, g, h, 26-d, i (C-b~C-j, adamantanone), 14 (—$OCH_3$).

EXAMPLE 2

Preparation of 2,3-adamantanone-L-tartaric Acid

The adamantone tartaric ester (3.4 g, 0.01 mol) prepared in Example 1 was dissolved in a mixture of NMP (20 ml) and a 30 wt% solution of potassium hydroxide (3 g) in water (10 g). The reaction mixture was refluxed for 6 hours, and the mixture carefully neutralized with the addition of dilute HCl. The product, 2,3-adamantanone-L-tartaric acid, was isolated by column chromatography (ethyl acetate eluant) as a white waxy solid which was used directly in the next example.

EXAMPLE 3

Preparation of poly(2,3-adamantanone-L-tartratic anhydride)

The tartaric acid acetal prepared in Example 2 (2.8 g, 0.01 mol), and 4-dimethylamino pyridine (12 mg, 0.1 mmol) were dissolved in acetic anhydride (5 g, 0.05 mol) and the reaction mixture stirred at 130° C. for 6 hours. The temperature was then elevated to 190° C. for a further 10 hours and vacuum applied to remove acetic acid. On cooling the solid polymer product was dissolved in DMSO and purified by precipitation into toluene.

EXAMPLE 4

Preparation of dimethyl 2,3-norcamphor-L-tartrate

A mixture of dimethyl L-tartrate (17.79 g, 0.11 mol), norcamphor (11.24 g, 0.1 mol), and p-toluenesulfonic acid (500 mg) in toluene (150 ml) was refluxed for 48 h (Dean-Stark water separator, 1.6 ml of water). The solution was cooled and washed with aqueous sodium bicarbonate (5%, 2×100 ml), water (100 ml) and brine (100 ml). The organic layer was dried ($MgSO_4$), filtered, and solvent removed under reduced pressure to give dimethyl 2,3-norcamphor-L-tartrate as colorless liquid (24 g) in 89% yield. $^1$H NMR (200 MHz, $CDCl_3$, δ ppm): 4.55~4.65 [m, 2H, —COCH(O)CH(O)CO—], 1.5~2.5 (m, 10H, H-b~H-g, norcamphor), 1.40 (s, 6H, —$OCH_3$). $^{13}$C NMR (200 MHz, $CDCl_3$, δ ppm): 169 (—$CO_2$—), 121 [—O(R)C(R)O—], 77 [—CHCH(O)$CO_2$—], 45, 44, 37, 35, 28, 22 (C-b~C-g, norcamphor), 14 (—$OCH_3$).

EXAMPLE 5

Preparation of 2,3-norcamphor-L-tartaric Acid

The norcamphor tartaric ester (2.7 g, 0.01 mol) prepared in Example 4 was dissolved in a mixture of γ-butyrolactone (20 ml) and a 30 wt % solution of potassium hydroxide (3 g) in water (10 g). The reaction mixture was refluxed for 10 hours, and the mixture neutralized with the addition of trifluoroacetic acid. The product, 2,3-norcamphor-L-tartaric acid, was isolated by column chromatography (ethyl acetate eluant) as a hygroscopic white solid which was dried under vacuum and used directly in the next example.

EXAMPLE 6

Preparation of poly(2,3-norcamphor-L-tartratic anhydride)

The tartaric acid acetal prepared in Example 5 (2.4 g, 0.01 mol), and 4-dimethylamino pyridine (12 mg, 0.1 mmol) were dissolved in acetic anhydride (5 g, 0.05 mol) and the reaction mixture stirred at 130° C. for 6 hours. The temperature was then elevated to 190° C. for a further 10 hours and vacuum applied to remove acetic acid. On cooling the solid polymer product was dissolved in DMSO and purified by precipitation into toluene.

The invention has been described with respect to preferred embodiments. However, as those skilled in the art will recognize, modifications and variations in the specific details, which have been described and illustrated, may be resorted to without departing from the spirit and scope of the invention as defined in the appended claims.

What is claimed is:

1. A polymer composition particularly suitable for use as a photoresist, comprising the structure:

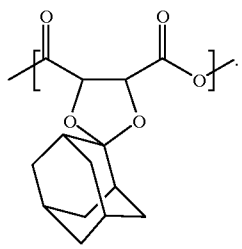

2. The polymer composition as claimed in claim 1 further including a photoacid generator so as to form a photoresist.

3. A polymer particularly suitable for use as a photoresist, comprising:
   is a) a poly tartaric anhydride backbone;
   b) an acetal protected 1,2 diol group wherein the acetal group is a pendant fused ring.

4. The polymer as claimed in claim 3 wherein the acetal group is an adamantone group.

5. The polymer as claimed in claim 3 wherein the acetal group is a norcamphor group.

6. A polymer composition particularly suitable for use as a photoresist, comprising the structure:

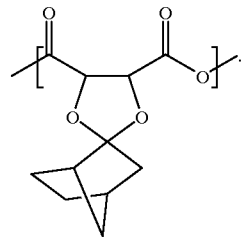

7. The polymer composition as claimed in claim 6 further including a photoacid generator so as to form a photoresist.

* * * * *